United States Patent
Kida et al.

(10) Patent No.: US 7,049,505 B2
(45) Date of Patent: May 23, 2006

(54) WIRE MEMBER AND METHOD OF FABRICATING SAME

(75) Inventors: Jun Kida, Tokyo (JP); Ryoji Tanaka, Tokyo (JP)

(73) Assignee: JEOL Ltd., Tokyo (JP)

( * ) Notice: Subject to any disclaimer, the term of this patent is extended or adjusted under 35 U.S.C. 154(b) by 397 days.

(21) Appl. No.: 10/286,393

(22) Filed: Nov. 1, 2002

(65) Prior Publication Data

US 2003/0111257 A1 Jun. 19, 2003

(30) Foreign Application Priority Data

Nov. 5, 2001 (JP) .............................. 2001-339190

(51) Int. Cl.
*H01B 7/34* (2006.01)

(52) U.S. Cl. ...................................................... 174/36

(58) Field of Classification Search ................ 174/36, 174/126.1, 126.2, 128.1, 128.2
See application file for complete search history.

(56) References Cited

U.S. PATENT DOCUMENTS

| | | | |
|---|---|---|---|
| 3,091,732 A * | 5/1963 | Anderson et al. ............ 324/321 |
| 3,147,457 A * | 9/1964 | Gill et al. ....................... 338/28 |
| 3,386,861 A * | 6/1968 | Stroik .......................... 136/233 |
| 3,570,118 A * | 3/1971 | Reynolds et al. .............. 29/599 |
| 3,833,145 A * | 9/1974 | Crosby et al. ............... 374/183 |
| 4,422,330 A * | 12/1983 | Fischell ..................... 73/514.14 |
| 4,640,983 A * | 2/1987 | Comte ...................... 174/119 R |
| 5,760,341 A * | 6/1998 | Laske et al. .............. 174/126.2 |
| 6,130,598 A * | 10/2000 | Katsuki et al. ................ 338/28 |
| 6,191,583 B1 * | 2/2001 | Gerald et al. ................ 324/318 |
| 6,305,841 B1 * | 10/2001 | Fukaya et al. ............... 374/185 |
| 6,698,922 B1 * | 3/2004 | Adachi et al. ............... 374/208 |
| 6,720,769 B1 * | 4/2004 | Gerald et al. ................ 324/318 |
| 6,791,326 B1 * | 9/2004 | Gerald et al. ................ 324/318 |
| 2003/0228681 A1 * | 12/2003 | Ritts et al. ................. 435/287.2 |

FOREIGN PATENT DOCUMENTS

WO     WO 96/00400 A * 1/1996
WO     WO9600400     4/1996

OTHER PUBLICATIONS

"A Magnetic Susceptibility Apparatus for Weakly Magnetic Metals, and the Susceptibility of Pure Copper in the Ranger 6-300° K", C. M. Hurd, *Cryogenics*, Oct. 1996, pp. 264-269.

* cited by examiner

*Primary Examiner*—William H. Mayo, III
(74) *Attorney, Agent, or Firm*—The Webb Law Firm

(57) ABSTRACT

A wire member adapted to be used in a detection coil of an NMR spectrometer's probe. The wire member has a sleeve made of a copper tube having a high electrical conductivity, strands made of platinum, and a thin film of gold or rhodium formed on the surface of the sleeve by plating. The strands are mounted inside the sleeve and have a cross section to cancel the magnetic susceptibility due to the sleeve. The thin film cancels the total magnetic susceptibility of the sleeve and strands.

3 Claims, 2 Drawing Sheets

WIRE MEMBER AND METHOD OF FABRICATING SAME

BACKGROUND OF THE INVENTION

1. Field of the Invention

The present invention relates to NMR (nuclear magnetic resonance) equipment and, more particularly, to a wire member for use in a detection coil incorporated in an NMR probe that directs RF waves at a sample and detects RF waves arising from the sample. The invention also relates to a method of fabricating this wire member.

2. Description of Related Art

In the field of chemical analysis, high-resolution NMR spectroscopy has been widely used. NMR provides a means that is quite useful in determining the molecular structures of samples.

Normally, proton $^1$H and carbon $^{13}$C are used to determine the molecular structures by NMR. These isotopes have chemical shifts reflecting the surrounding atomic arrangement. The chemical shifts can be observed as NMR frequency differences. Determination of a molecular structure is performed by investigating the spatial coupling between atoms based on the observed chemical shift.

FIG. 4 is a block diagram schematically showing NMR equipment used for NMR spectroscopy. The NMR equipment, generally indicated by reference numeral 20, comprises a main magnet 21 for producing a static magnetic field to be applied to a sample 27, an NMR spectrometer 22 for performing NMR spectroscopy, a power amplifier 23 for power-amplifying RF pulses delivered from the NMR spectrometer 22, a preamplifier 24 for preamplifying a detection signal applied to the NMR spectrometer 22, and a duplexer 25 for duplexing and/or unduplexing the power amplifier 23 or preamplifier 24 signals.

FIG. 5 shows a probe for use in the NMR equipment described above. Normally, a sample 31 is dissolved in deuterium or a deuterated organic solvent and held in a glass test tube 32. The main magnet 21 (FIG. 4) applies a uniform static magnetic field to the sample 31. The probe 30 is fitted with a detection coil 33 and mounted close to the test tube 32.

An RF pulse having a frequency almost equal to the resonance frequency is applied to the sample 31 from the NMR spectrometer 22 (FIG. 4) via the power amplifier 23. The sample 31 produces an RF magnetic field, or an NMR signal, in resonance with the magnetic-field component of the RF pulse. The NMR signal is detected as an induction current through the detection coil 33. The detected current is sent to the NMR spectrometer 22 via the preamplifier 24.

Signals from atomic nuclei contained in the sample 31 can be discriminated based on the NMR frequencies received by the NMR spectrometer 22. In many cases, atomic nuclei to be investigated are protons $^1$H. Chemical shifts due to the atomic arrangement around the protons $^1$H exist.

Chemical shifts cover a range on the order of ppm. The width of an NMR signal is approximately $10^{-3}$ ppm. To separate signals well, the inhomogeneity of the static magnetic field applied to the sample 31 within the test tube 32 needs to be small. If the inhomogeneity of the static magnetic field applied to the sample 31 increases, the NMR signal will be broadened, and the instrumental resolution will deteriorate.

Therefore, the NMR equipment 20 (FIG. 4) uses the main magnet 21 to produce a uniform magnetic field accurately. Usually, a current shim set 26 capable of producing a desired magnetic field gradient is mounted between the main magnet 21 and probe 30. The current through the current shim set 26 is controlled by the NMR spectrometer 22 to cancel the residual inhomogeneous component of the main magnetic field. That is, shimming is done. The resolution adjustment using the shimming is quite complex, which makes operations on the NMR instrument quite difficult.

The probe 30 is inserted within a uniform magnetic field produced by the aforementioned technique to detect the NMR signal produced from the sample 31. However, if the probe 30 has a magnetic property, the surrounding uniform static magnetic field is perturbed.

Since the detection coil 33 of the probe 30 is placed closest to the sample 31, the static magnetic field near the sample 31 is affected conspicuously by the magnetic susceptibility of the detection coil 33. Often, magnetic field distortion by the effects of such a close magnetic field cannot be removed by the outside current shim set 26. If an inappropriate material is selected as the detection coil 33, it is quite difficult to correct the instrumental resolution. For this reason, a material (e.g., copper or aluminum) not including any ferromagnetic material, such as iron, and possessing a small magnetic susceptibility is used in the probe 30.

Preferably, the Q value of the detection coil 33 is set higher in securing a high sensitivity in detecting signals. Therefore, the detection coil 33 is made of a material having a high electrical conductivity, such as copper.

To reduce magnetic effects, the detection coil 33 is made of a thin or slender material. However, a high electrical conductivity needs to be secured in order to secure a high Q value. Therefore, the material has a sufficient thickness. Accordingly, the suppression of magnetic effects and securing a high electrical conductivity are conflicting requirements.

Materials that satisfy these requirements about the detection coil 33 (i.e., are low in magnetic susceptibility and high in electrical conductivity) have been heretofore proposed. For instance, they are combinations of two or more kinds of pure metals having mutually canceling magnetic susceptibilities. One example is copper wire having an aluminum core. Another example consists of two pieces of copper foil between which a piece of aluminum foil is sandwiched.

These materials do not result in a decrease in the electrical conductivity. However, these different metals are different in hardness or processed to different levels of hardness. It is difficult to wire draw or roll combinations of them uniformly. Cross sections of these raw materials tend to lack uniformity. Therefore, the magnetic susceptibility is distributed nonuniformly, in the same way as in the first-mentioned case. This impairs the magnetic field uniformity.

Furthermore, it has been experimentally found that it is quite difficult to avoid adhesion of the metallic iron component introduced during a wire-drawing process or rolling process, the component being created by a machine tool (C. M. Hurd, Cryogenics, October 1966, pp. 264–269). The adhesion of the metallic iron component to raw materials can be checked by electron microscopy.

Adhesion of metallic iron to a raw material is briefly described. As an example, copper is a diamagnetic material. After undergoing a wire-drawing or rolling process, the magnetic susceptibility of the inherent diamagnetism often decreases by more than 60%. Furthermore, the magnetic susceptibility varies greatly among measurement locations. The sign of the magnetic susceptibility is frequently inverted and even paramagnetism may be exhibited, because the adhering metallic iron produces a magnetic field that is $10^6$ times stronger than the field produced by the same weight of copper.

Metallic iron severely affecting the magnetic property of the raw material in this way can be regarded as a magnetic contaminant for the raw material. However, the weight ratio to the base material is only less than 10 ppm, which is less than the amount that can be identified as an impurity by chemical analysis. Therefore, this by no means infringes the industrial standards regarding purity. For example, where a spot of iron corresponding in weight to 10 ppm adheres to a portion 1 cm long, a local magnetic field that cannot be corrected by the current shim set 26 is produced. This fatally deteriorates the resolution of the NMR instrument.

SUMMARY OF THE INVENTION

It is an object of the present invention to provide a wire member which is for use in a detection coil incorporated in an NMR spectrometer's probe and which has a small magnetic susceptibility and a high electrical conductivity.

It is another object of the present invention to provide a method of fabricating this wire member.

A wire member according to the present invention comprises: at least one first wire component made of a first metal having a high electrical conductivity; at least one second wire component made of a second metal having a magnetic susceptibility opposite in sign to that of the first wire component, the second wire component being disposed close and parallel to the first wire component; and a thin film made of a third metal formed on at least one surface of the first and second wire components. The third metal has a magnetic susceptibility opposite in sign to the total magnetic susceptibility of the first and second wire components.

Preferably, the wire member according to the present invention is used as the winding of a detection coil for detecting an NMR signal arising from a sample, the detection coil being incorporated in an NMR spectrometer's probe.

It is desired that the magnetic susceptibility of the second wire component have a cross section having a magnetic susceptibility that almost cancels the magnetic susceptibility due to the first wire component. Preferably, the ratio of the cross sections of the first and second wire components is substantially equal to the ratios of the reciprocals of the magnetic susceptibilities of the first and second wire components, respectively. Preferably, the thin film has such a thickness as to cancel the total magnetic susceptibility of the first and second wire components.

Preferably, the wire member includes third, fourth, and fifth wire components different in magnetic susceptibility from the first and second wire components, in addition to the first and second wire components. In this case, the total magnetic susceptibility of the first, second, third, fourth, and fifth wire components nearly cancels out and only a small magnetic susceptibility remains.

In one feature of the present invention, the thin film is formed on at least one surface of the first, second, third, fourth, and fifth wire components and has such a thickness as to cancel out the remaining small magnetic susceptibility.

Preferably, the first wire component has a tubular shape. The second wire component is housed in the first wire component. The thin film is formed on the surface of the first wire component.

Preferably, the first metal is copper. The second metal is platinum. The third metal is gold or rhodium.

Preferably, the first metal has a diamagnetic susceptibility. The second metal has a paramagnetic susceptibility. The third metal has a diamagnetic or paramagnetic susceptibility.

A method of fabricating a wire member according to the present invention comprises the steps of: preparing at least one first wire component made of a first metal having a high electrical conductivity and at least one second wire component made of a second metal having a magnetic susceptibility opposite in sign to that of the first wire component; placing the first and second wire components close and parallel to each other; and forming a thin film of a third metal on at least one surface of the first and second wire components. The third metal has a magnetic susceptibility opposite in sign to the total magnetic susceptibility of the first and second wire components.

Preferably, the wire component fabricated by the method described in the immediately preceding paragraph is used as the winding of a detection coil for detecting an NMR signal from a sample, the detection coil being incorporated in an NMR spectrometer's probe.

It is desired that the magnetic susceptibility of the second wire component have a cross section having a magnetic susceptibility that almost cancels the magnetic susceptibility due to the first wire component. Preferably, the ratio of the cross sections of the first and second wire components are substantially equal to the ratios of the reciprocals of the magnetic susceptibilities of the first and second wire components, respectively. Preferably, the thin film has such a thickness as to cancel the total magnetic susceptibility of the first and second wire components.

Preferably, the first wire component has a tubular shape. The second wire component is housed in the first wire component. The thin film is formed on the surface of the first wire component by plating or evaporation.

Preferably, the first metal is copper. The second metal is platinum. The third metal is gold or rhodium.

Preferably, the first metal has a diamagnetic susceptibility. The second metal has a paramagnetic susceptibility. The third metal has a diamagnetic or paramagnetic susceptibility.

Preferably, the first and second wire components are produced by separate process steps. After cut to necessary lengths, they are assembled. Preferably, the second wire component is housed within the first wire component.

Other objects and features of the invention will appear in the course of the description thereof, which follows.

DESCRIPTION OF THE PREFERRED EMBODIMENTS

An embodiment of the wire member according to the present invention is hereinafter described in detail with reference to the accompanying drawings.

Figure 1:
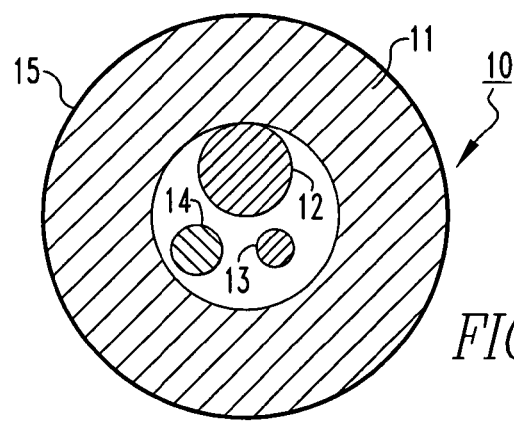
FIG. 1 is a cross-sectional view of a wire member.

FIG. 1 is a cross-sectional view of a wire member according to this embodiment. The wire member, generally indicated by reference numeral 10, is for use in an NMR (nuclear magnetic resonance) spectrometer's probe and comprises a sleeve 11 forming a tubular, first wire component made of a first metal, a plurality of strands (threads) 12–14 that are second wire components made of a second metal, and a thin film 15 made of a third metal. The wire member 10 is used as the winding of a detection coil for detecting NMR signals from a sample. The first metal sleeve 11 has a high electrical conductivity. The second metal strands 12–14 have a magnetic susceptibility opposite in sign to that of the sleeve 11. The magnetic susceptibility of the second metal cancels the magnetic susceptibility due to the sleeve 11. The strands 12–14 are accommodated in the sleeve 11. The sleeve 11 and strands 12–14 substantially cancel out their respective magnetic susceptibilities and result in a total magnetic susceptibility. The third metal has a magnetic susceptibility opposite in sign to the remaining total magnetic susceptibility. The thin film 15 is formed on the surface of the sleeve 1 to such a thickness as to cancel the total magnetic susceptibility.

In summary, the wire member 10 has the hollow, tubular sleeve 11, the rod-like first through third strands 12–14 accommodated inside the sleeve 11, and the thin film 15 plated or evaporated on the surface of the sleeve 11.

In FIG. 1, the first through third strands 12–14 are housed in the sleeve 11. It is to be understood that this constitutes merely one example. A desired number of strands of a desired kind can be accommodated inside the sleeve 11 as long as the hollow space permits.

During fabrication of a thin copper tube used as the sleeve 11 of the present embodiment, the outside and inside diameters were controlled with an accuracy of 1 µm. The copper tube was drawn through a special nonferrous die. Obviously, any thin copper tube has a high electrical conductivity.

The amount of adhering metallic iron arising from the aforementioned drawing process is quite small. Every thin copper tube has a value greater than 95% of the diamagnetic susceptibility of pure copper. Furthermore, variations of the magnetic susceptibility along the longitudinal direction are quite small.

The first through third strands 12–14 according to the present embodiment are made of platinum, which is much harder than copper. Therefore, the amount of adhering metallic iron is very small during a rolling or drawing process. Consequently, variation of the magnetic susceptibility due to adhesion of metallic iron substantially does not occur, unlike normal copper wires. Platinum has a high electrical conductivity similarly to copper.

In the present embodiment, the ratios of the cross sections of the components (i.e., the sleeve 11 made of a thin copper tube having diamagnetism and the first through third strands 12–14 made of platinum having paramagnetism) are set to the ratios of the reciprocals of the volume magnetic susceptibilities such that the total magnetic susceptibility almost cancels out to zero.

In practice, however, it is difficult to completely cancel out the total magnetic susceptibility of the sleeve 11 and first through third strands 12–14, and so a small total magnetic susceptibility remains. This is due to the accuracy of the cross sections of the sleeve 11 and first through third strands 12–14 and due to the magnetism of metallic iron adhering to these components 11–14.

Therefore, the wire member according to the present embodiment has the thin film 15 made of the third metal, the film being formed on the surface of the sleeve 11. The thickness of the thin film 15 is so set as to cancel out the total magnetic susceptibility of the sleeve 11 and first through third strands 12–14. The thin film may also be formed on the first through third strands 12–14 instead of on the sleeve 11. Specific examples of the wire member are given in Table 1.

TABLE 1

| No. | OD × ID of sleeve | OD × number of strands (threads) | specific magnetic susceptibility of Cu and strands (threads) | thin film |
| --- | --- | --- | --- | --- |
| 1 | 0.5 mm × 0.18 mm | 80 µ × 1, 30 µ × 2 | 2.6% | 1 µ (Au) |
| 2 | 0.5 mm × 0.15 mm | 80 µ × 1, 30 µ × 2 | −1.3% | 0.1 µ (Rh) |
| 3 | 0.8 mm × 0.3 mm | 100 µ × 2 | −0.3% | 0.03 µ (Rh) |
| 4 | 1 mm × 0.3 mm | 100 µ × 2, 80 µ × 2 | −1% | 0.14 µ (Rh) |

In the first example of this Table 1, the sleeve made of a copper tube has an outside diameter (OD) of 0.5 mm and an inside diameter (ID) of 0.18 mm. The sleeve houses one strand having an outside diameter of 80 µm and two strands each having an outside diameter of 30 µm. The strands are made of platinum. The total specific magnetic susceptibility of the sleeve and strands is 2.6%. A thin film of gold (Au) having a thickness of 1 µm is formed on the surface of the sleeve to cancel out this total specific magnetic susceptibility. Where the specific magnetic susceptibility of copper sleeve and strands is positive, the thin film is fabricated from gold having a negative magnetic susceptibility.

The specific magnetic susceptibility of copper sleeve and strands referred to herein is the percentage of the magnetic susceptibility of the wire member made up of the sleeve and strands as compared with that of a copper wire having the same diameter. A positive sign indicates a paramagnetic susceptibility, while a negative sign indicates a diamagnetic susceptibility.

The wire member fabricated in this way is made of a metal having a high electrical conductivity, such as copper, platinum, or rhodium. Therefore, the wire member has a high electrical conductivity as a whole.

In the second example of Table 1, the sleeve made of a copper tube has an outside diameter (OD) of 0.5 mm and an inside diameter (ID) of 0.15 mm. The sleeve houses one strand having an outside diameter of 80 µm and two strands each having an outside diameter of 30 µm. The strands are made of platinum. The total specific magnetic susceptibility of copper of this sleeve and strands is −1.3%. A thin film of rhodium (Rh) having a thickness of 0.1 µm is formed on the surface of the sleeve to cancel out this negative magnetic susceptibility, the rhodium having a positive magnetic susceptibility.

In the third example of Table 1, the sleeve made of a copper tube has an outside diameter (OD) of 0.8 mm and an inside diameter (ID) of 0.3 mm. The sleeve houses two strands each having an outside diameter of 100 µm. The strands are made of platinum. The total specific magnetic susceptibility of copper of the sleeve and strands is −0.3%. A thin film of rhodium (Rh) having a thickness of 0.03 µm is formed on the surface of the sleeve to cancel out this negative magnetic susceptibility, the rhodium having a positive magnetic susceptibility. Where the specific magnetic susceptibility of copper is negative in this way, the thin film is made of rhodium having a positive magnetic susceptibility.

In the fourth example of Table 1, the sleeve made of a copper tube has an outside diameter (OD) of 1 mm and an inside diameter (ID) of 0.3 mm. The sleeve houses two strands each having an outside diameter of 100 μm and two other strands each having an outside diameter of 80 μm. All the strands are made of platinum. The total specific magnetic susceptibility of copper of this sleeve and strands is −1%. A thin film of rhodium (Rh) having a positive magnetic susceptibility and a thickness of 0.14 μm is formed on the surface of the sleeve to cancel out this negative magnetic susceptibility.

The material of the strands (threads) of the wire member is not limited to platinum used in the above specific examples. For example, the strands may also be made of copper, aluminum, tungsten, molybdenum, or combinations thereof.

The wire member according to the present embodiment has flexibility and can be wound plural times. Therefore, it is possible to fabricate a coil having a high impedance. Consequently, this wire member is adapted for fabrication of a coil for $^{13}C$ nucleus having a lower resonance frequency than that of proton $^{1}H$. A method of fabricating the wire member of the construction described above is described next.

This fabrication method is used to fabricate the wire member employed in a detection coil for detecting an NMR signal from a sample, the detection coil being mounted in an NMR spectrometer's probe. This method starts with placing one or more strands 12–14 into the sleeve 11 that is a tubular, wire component made of the first metal having a high electrical conductivity. The strands 12–14 are second wire components made of the second metal that has a magnetic susceptibility opposite in sign to that of the sleeve 11. The magnetic susceptibility of the second metal cancels the magnetic susceptibility due to the sleeve 11. Then, secondary processing is carried out to form the thin film 15 of the third metal by plating or evaporation. The third metal has a magnetic susceptibility opposite in sign to the total magnetic susceptibility of the sleeve 11 and strands 12–14.

The sleeve 11 and the strands 12–14 are fabricated by separate process steps. After cut to required lengths, they are assembled. That is, the strands 12–14 are placed within the cut sleeve 11.

Strands, such as the strands 12–14, are successively produced by a dedicated drawing machine and so relatively clean strands to which no metallic iron adheres are available from the market. Cross sections of the strands 12–14 that are magnetically equivalent to the sleeve 11 can be obtained by combining these various strands of different magnetic susceptibilities.

The third metal is formed by plating or evaporation (herein referred to as the secondary processing) on the surface of the sleeve 11 to a thickness that cancels the total magnetic susceptibility of the sleeve 11 and first through third strands 12–14. Thus, the thin film 15 is formed. The thin film 15 of the third metal may be formed on the first through third strands 12–14, as well as on the sleeve 11.

During the secondary processing, the thickness of the thin film 15 is accurately controlled to bring the total magnetic susceptibility of the sleeve 11, strands 12–14, and thin film 15 closer to zero.

This secondary processing is carried out using a small-sized apparatus while controlling the thickness of the thin film continuously. The secondary processing may also be performed after shaping the wire member into the form of a detection coil.

Where the total magnetic susceptibility of the sleeve 11 and strands 12–14 is negative, the secondary processing is performed with rhodium (Rh). On the other hand, where the susceptibility is positive, gold (Au) is used. The desired thickness of the thin film can be accurately controlled by a plating or evaporation process.

The wire member of the present embodiment is applied to a detection coil of an NMR probe, the coil being adapted for an NMR sample tube having a nominal diameter of 5 mm. This probe is primarily used to observe $^{13}C$ nucleus and secondarily used to observe $^{1}H$ nucleus. The detection coil consists of two turns of wire (i.e., wire member) to secure a sufficient sensitivity in observing $^{13}C$ nucleus. Another detection coil is placed outside to observe $^{1}H$.

Figure 2:
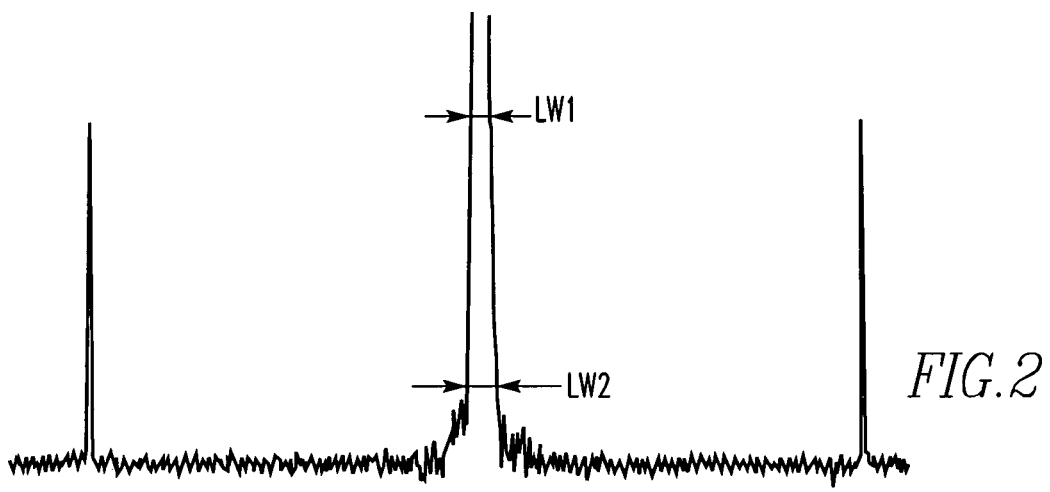
FIG. 2 is a diagram showing an NMR spectrum obtained using a wire member according to an embodiment of the present invention.
Figure 3:
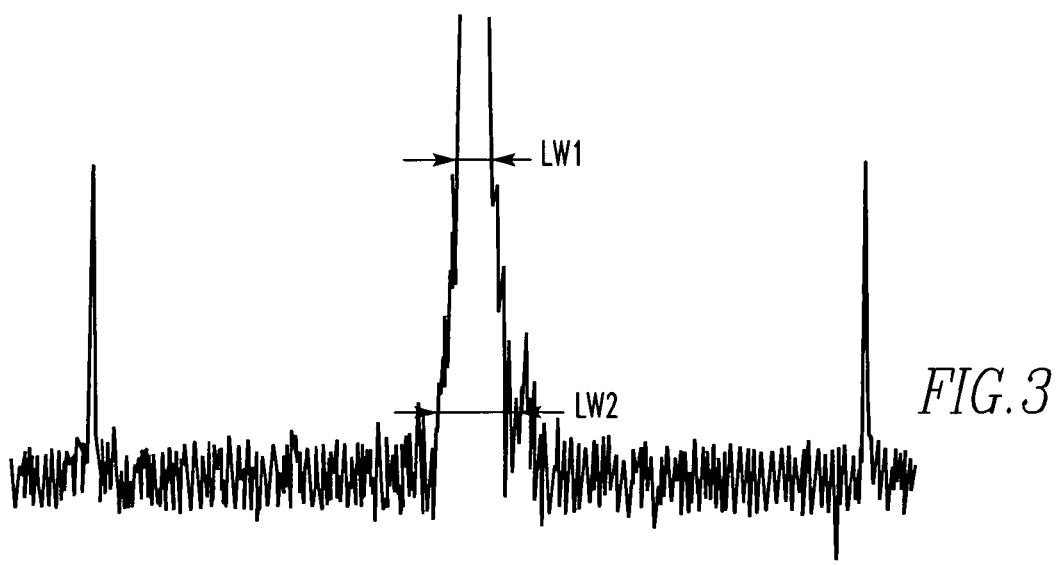
FIG. 3 is a diagram showing an NMR spectrum obtained using a conventional wire member.
Figure 4:
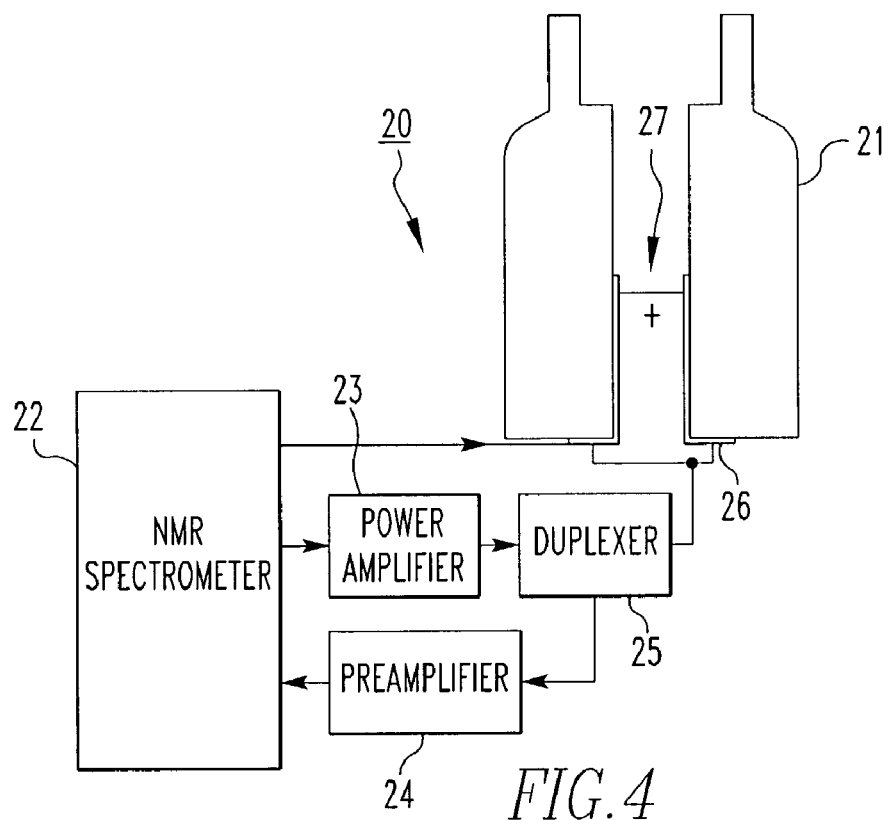
FIG. 4 is a block diagram schematically showing NMR equipment.
Figure 5:
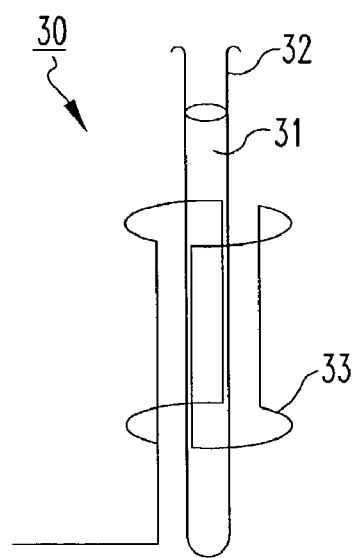
FIG. 5 is a schematic view of a probe for use in the NMR equipment.

FIGS. 2 and 3 show NMR spectra of $^{1}H$ detected using the probe described above. FIG. 2 shows an NMR spectrum detected using a detection coil fabricated by using the wire member given in the second example of Table 1. FIG. 3 shows an NMR spectrum detected using a detection coil fabricated by using a conventional wire member such as copper wire, for comparison with the present embodiment.

A singlet due to protons of chloroform appears at the center of each spectrum of FIGS. 2 and 3. In each spectrum, the lateral width (LW1) measured at 0.55% of the peak height and the lateral width (LW2) measured at 0.11% of the peak height are compared.

With the conventional detection coil shown in FIG. 3, the widths LW1 and LW2 are at 10 Hz and 20 Hz, respectively. On the other hand, with the wire member of the present embodiment shown in FIG. 2, the widths LW1 and LW2 are at 5 Hz and 7.5 Hz, respectively. In this way, with the detection coil of the present embodiment, a spectrum having a higher resolution and a peak of sharper linewidth is obtained compared with the case in which the conventional detection coil is used, because the detection coil of the wire member of the present embodiment has a magnetic susceptibility much smaller than that of the conventional detection coil.

Where the wire member of the present embodiment is used in this way, detection coils fitted in the probe have small magnetic susceptibilities. In consequence, it is possible to suppress the resolution deterioration of the NMR spectrum due to the interaction between the detection coils of the probe or the effects of the magnetic susceptibility of each detection coil itself.

The method of fabricating the wire member according to the present embodiment makes it possible to fabricate the wire member having a very small magnetic susceptibility without experiencing a rolling or wire-drawing step during which the magnetic susceptibility tends to be increased due to adhesion of metallic iron.

Furthermore, a wire member having a small magnetic susceptibility can be fabricated by selecting desired ones from mass-produced components of desired dimensions (i.e., that are readily available from the market), combining components having desired magnetic susceptibilities, and performing the secondary processing.

The effects of the magnetic susceptibility of the detection coil can be suppressed by fabricating the detection coils of an NMR spectrometer's probe from such a wire member having a small magnetic susceptibility. As a result, the resolution of the NMR spectrum can be improved.

According to the present invention, a wire member can be offered which is adapted to be used in a detection coil incorporated in an NMR spectrometer's probe and which has a high electrical conductivity and a small magnetic susceptibility.

Having thus described our invention with the detail and particularity required by the Patent Laws, what is desired protected by Letters Patent is set forth in the following claims.

The invention claimed is:

1. A wire member for use in a detection coil that detects an NMR (nuclear magnetic resonance) signal from a sample, said wire member comprising:
    at least one first wire component made of a first metal having a high electrical conductivity;
    at least one second wire component made of a second metal having a magnetic susceptibility opposite in sign to magnetic susceptibility of said first wire component, said second wire component disposed inside said first wire component; and
    a thin film less than about 1 micron thick made of a third metal, said third metal having a magnetic susceptibility opposite in sign to a total magnetic susceptibility of said first and second wire components,
    wherein said first wire component has a tubular shape and holds said second wire component therein, and wherein said thin film is formed on a surface of said first wire component.

2. The wire member of claim 1, wherein said first metal is copper, said second metal is platinum, and said third metal is one of gold and rhodium.

3. The wire member of claim 1, wherein said first metal has a damagnetic susceptibility, said second metal has a paramagnetic susceptibility, and said third metal has one of a diamagnetic susceptibility and a paramagnetic susceptibility.

* * * * *

UNITED STATES PATENT AND TRADEMARK OFFICE
CERTIFICATE OF CORRECTION

PATENT NO. : 7,049,505 B2  
APPLICATION NO. : 10/286393  
DATED : May 23, 2006  
INVENTOR(S) : Kida et al.

Page 1 of 1

It is certified that error appears in the above-identified patent and that said Letters Patent is hereby corrected as shown below:

Column 10, line 12, claim 3, "a damagnetic susceptibility" should read -- a diamagnetic susceptibility --

Signed and Sealed this

Seventh Day of November, 2006

JON W. DUDAS  
*Director of the United States Patent and Trademark Office*